United States Patent [19]

Imai

[11] Patent Number: 5,266,501
[45] Date of Patent: Nov. 30, 1993

[54] METHOD FOR MANUFACTURING A SOLID STATE IMAGE SENSING DEVICE USING TRANSPARENT THERMOSETTING RESIN LAYERS

[75] Inventor: Takehiko Imai, Yokohama, Japan

[73] Assignee: Kabushiki Kaisha Toshiba, Kanagawa, Japan

[21] Appl. No.: 879,013

[22] Filed: May 6, 1992

[30] Foreign Application Priority Data

May 9, 1991 [JP] Japan ................. 3-104112

[51] Int. Cl.$^5$ .................. H01L 21/28; H01L 21/56; H01L 21/60
[52] U.S. Cl. ......................... 437/2; 437/53; 437/180; 437/211
[58] Field of Search ............ 437/2, 180, 211, 228, 437/229, 904

[56] References Cited

U.S. PATENT DOCUMENTS

| 4,388,128 | 6/1983 | Ogawa et al. | 156/273.7 |
| 4,523,102 | 6/1985 | Kazufumi et al. | 522/21 |
| 4,560,457 | 12/1985 | Ogawa | 522/71 |
| 4,650,985 | 3/1987 | Okibayashi et al. | 250/214.1 |

*Primary Examiner*—Olik Chaudhuri
*Assistant Examiner*—David E. Graybill
*Attorney, Agent, or Firm*—Finnegan, Henderson, Farabow, Garrett & Dunner

[57] ABSTRACT

A method of manufacturing a solid state image sensing device comprising the steps of: forming and maintaining a color filter layer, a lens layer and/or a light reflection preventing layer via a transparent thermosetting resin layer, on a semiconductor substrate; forming a mask layer of a photosetting resin to expose an electrode on the semiconductor substrate surface after the layer forming and maintaining step; and exposing the electrode surface by selectively removing the transparent thermosetting resin layers by use of the mask layer.

3 Claims, 3 Drawing Sheets

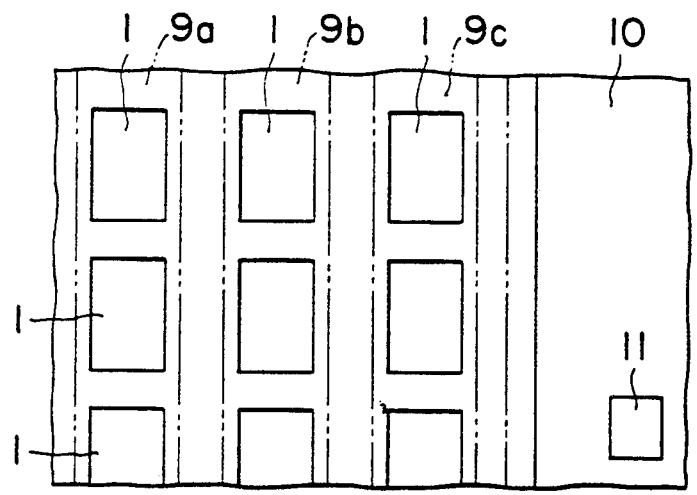
F I G. 4
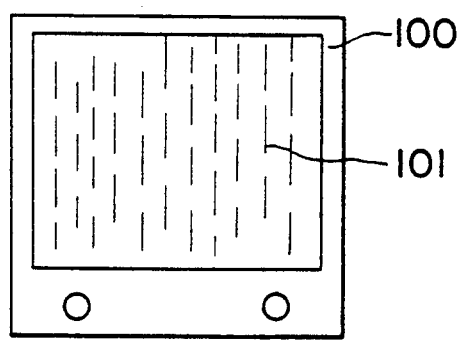
F I G. 5

METHOD FOR MANUFACTURING A SOLID STATE IMAGE SENSING DEVICE USING TRANSPARENT THERMOSETTING RESIN LAYERS

BACKGROUND OF THE INVENTION

The present invention relates to a solid state image sensing device suitable for use as broadcasting triple cameras, still cameras, copying machine, facsimile, etc. and a method of making the same device.

As the prior art solid state image sensing device used for broadcasting triple cameras and still cameras, there is a well known structure such that a light reflection preventing film such as a black filter is formed between columns of two-dimensionally arranged photosensitive portions. This light reflection preventing film is effective to prevent light reflected from light shielding films (formed away from the photosensitive portions) from being allowed to be incident again upon the photosensitive portions, thus improving the flare characteristics. The solid state image sensing device provided with the light reflection preventing film as described above is mainly adopted for high performance solid state image sensing device for broadcasting use, for instance.

In the solid state image sensing device as described above, photodiode portions which constitute photosensitive portions and CCD portions are formed on the surface of a semiconductor substrate. Further, a black light reflection preventing film is provided over the CCD portions via a transparent photo-crosslinking smoothing layer hardened by light irradiation, and additionally a lens layer of a semicircular cross-section is formed over the photodiodes via a similar smoothing layer, for improvement of photosensitivity of the photosensitive portions. Further, a protective layer made of the same material as the smoothing layer is formed on the uppermost layer of the device.

Further, in the case of the image sensing devices used for apparatus (e.g., still cameras) which require an excellent color reproducibility, there is known a device in which three primary color (green, red and blue) filters of different layers are formed being arranged in, for example, strip fashion in the column direction so as to correspond to the two dimensionally arranged photodiodes.

There are also known a device of complementary color type which is mainly used for home-use camcorder and a device having a one dimensionally (linearly) arranged photodiodes which is mainly used for copying machines, facsimiles, etc. In the solid state image sensing device as described above, resist printing layers are formed between the two color filter layers, respectively and a protective layer is further formed on the uppermost layer. These layers are all formed of transparent photo-crosslinking layers.

In the solid state image sensing device as described above, the construction is such that bonding pads for providing electrodes are formed spaced apart from the photodiode portions and the CCD portions; and the smoothing layers, resist printing layers and protective layer are all removed over the bonding pads in order to provide the electrodes.

In manufacturing the prior art solid state image sensing device as described above, it is important to make smooth the surfaces of the respective layers, and therefore the these layers are formed of a transparent smoothing layer of photo-crosslinkage type, respectively, as already described. To form the smoothing layer, a chemical such as acrylic polymer with photosensitive chemical, for example, "FVR" (Trademark of FUJI YAKUHIN) is applied all over the surface and then selectively exposed to light, and then developed by methyl ethyl ketone liquid, for instance.

Further, in the method of manufacturing the prior art solid state image sensing device, it has been necessary to remove various film materials formed over the bonding pads in order to secure the electrical connection to the solid state image sensing devices, in the process for forming color filters on the surface of the semiconductor substrate. For facilitation of the removal of the film forming materials, it has been necessary to use the material of photo-crosslinked type for the transparent resin layers such as the smoothing layers, resist printing layers, and protective layer, except the light reflection preventing film, the color filters, and the lens layer.

However, in the case of the present transparent photo-crosslinking resin material such as the above-mentioned "FVR" of FUJI YAKUHIN, a perfect cross linkage rate is not obtained by light exposure, and additionally there exists a problem in that the transparent resin layer tends to shrink due to thermal hysteresis after patterning process.

As described above, since the dimensions of the light reflection preventing film, the color filters, and the lenses are subjected to variation due to shrinkages of the smoothing layers, the photoresist printing layers, and the protective layer all enclosing these film, filters and lenses, it has been so far necessary to design the pattern under due consideration of the shrinkage after light exposure. In this case, however, there still exists a problem in that the previously anticipated shrinkage rate fluctuates due to the variation of the thermal process, manufacturing control conditions or the dispersion between the material manufacturing lots. In the case of the solid state image sensing device, when the relative positional relationship among the color filters, the light reflection preventing film, and the lens layer changes being offset from the designed values, the quality of the image is markedly deteriorated. In the case of ⅔ inch size CCD device having 400 thousand pixels, for instance, although the pitch of the pixels is on the order of 10 μm, when the relative positional offset is on the order of several micrometers, a serious problem arises in that defective bright or dark straight lines 101 are observed in the vertical direction on a video picture 100, as shown in FIG. 5, thus resulting in defective products.

SUMMARY OF THE INVENTION

With these problems in mind, therefore, it is the primary object of the present invention to provide a solid state image sensing device less in image defectiveness due to the dispersion of manufacturing or material lots, and the process of making the same.

In the solid state image sensing device according to the present invention, the material for constructing the solid state image sensing device is replaced with transparent thermosetting resin instead of the transparent photo-crosslinking resin, in order to reduce the variation of the dimensions or to improve the stability of the dimensions. This is because in the case of the material of the solid state image sensing device, slight dislocations of the relative positional relationship between the respective layers will cause defective images. Further, in manufacturing the color filter layer, the lens layer and- /or the light reflection preventing film layer, a transparent thermosetting resin layer is selectively removed collectively in order to expose the electrode surfaces over the bonding pads at the final stage of forming the respective layers, without exposing the transparent resin layers, respectively, as is conventional.

BRIEF DESCRIPTION OF THE DRAWINGS

In the accompanying drawings:

FIG. 4 is a plan view showing the elements of the embodiment shown in FIG. 3; and FIG. 5 is a view showing an example of defective video images, in which bright or dark straight lines are observed in the vertical direction thereof.

DETAILED DESCRIPTION OF THE PREFERRED EMBODIMENTS

Figure 1A:
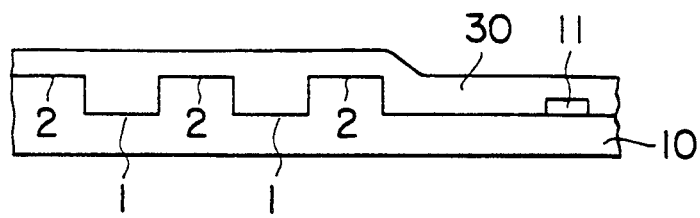
FIGS. 1A to 1E are cross-sectional views showing the elements in the order of the manufacturing steps, for assistance in explaining the manufacturing method of the solid state image sensing device according to the present invention.

As shown in FIG. 1A, a photosensitive portion composed of photodiode portions 1 arranged in matrix form and CCD portions 2 arranged in parallel to the respective columns of the matrix is formed on the surface of a semiconductor substrate 10. Further, a bonding pad for providing an electrode is formed at a position away from the photodiode portions 1 and the CCD portions 2 on the surface of the semiconductor substrate 1. A transparent thermosetting resin layer 30 which is an acrylic polymer including thermosetting chemical as an additive such as "OPTOMER SS" (Trademark of NIHON GOUSEI GOMU Co., Ltd.) is applied all over the surfaces of these elements. Thereafter, the transparent thermosetting resin layer 30 is hardened by thermal baking process at 130° C. for 10 min. This transparent thermosetting resin layer 30 serves to make flat the areas of the photodiode portions 1 and the CCD portions 2 and additionally to cover the bonding pad 11.

Figure 1B:
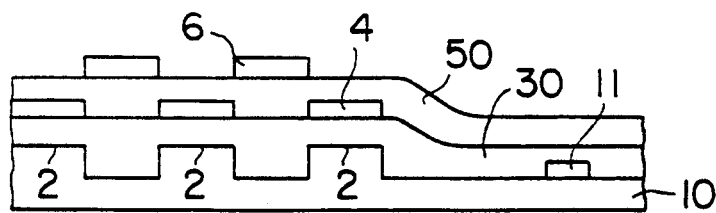
Figure 1C:
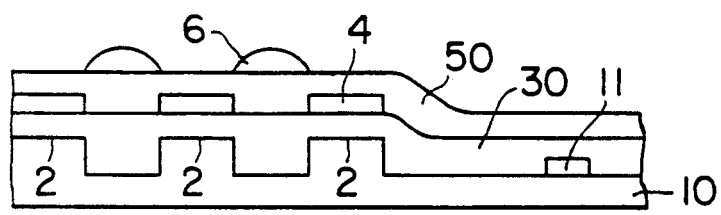

Further, as shown in FIG. 1B, casein or gelatin is applied to the surface of the resin layer 30; after dyeing, a black light reflection preventing film 4 is formed over the CCD portions 2 by selective exposure. By forming this light reflection preventing film 4, it is possible to shade light reflected from a light shielding film (not shown) formed at positions other than the photosensitive portions, thus improving the flare characteristics of the image sensing device. Subsequently, a smoothing layer 50 is formed by applying the transparent thermosetting resin and then heating the same resin for hardening. This smoothing layer 50 serves as a dye preventing layer. Further, a lens layer 6 is formed just over the photodiode portions 1 as shown in FIG. 1B and is subjected to heating to obtain semicircular cross-section lenses by flowing the material as shown in FIG. 1C to improve the sensitivity of the photosensitive portion.

Figure 1D:
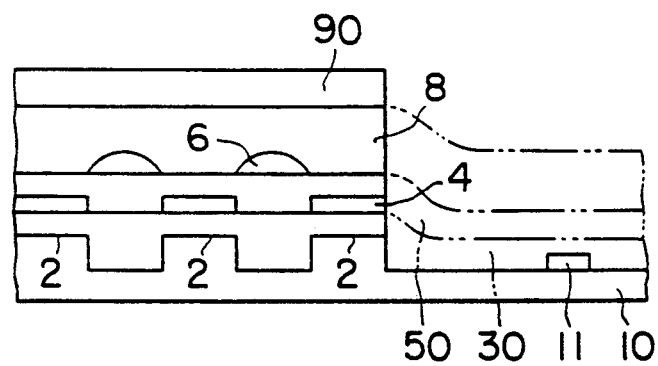

Thereafter, as shown in FIG. 1D, to expose the bonding pads 11 for providing electrodes, a buffer water soluble film 80 such as casein is applied to make flat the surface thereof; a film 90 of anti-oxygen etching characteristics such as novolak resin containing photosensitive chemical, for example "ONPR800HS" (Trademark of TOKYO OHKA) or styrene resin containing photosensitive chemical, for example, "BMS" (Trademark of TOSO Co., Ltd.) is applied thereon and selectively exposed to light to form a mask layer for exposing only the perimeter of the electrodes 11. By use of the formed mask layer, the smoothing layers 50 and 30 all formed of the transparent thermosetting resin are removed by oxygen to expose the bonding pad portions 11 formed on the surface of the semiconductor substrate 10.

Figure 1E:
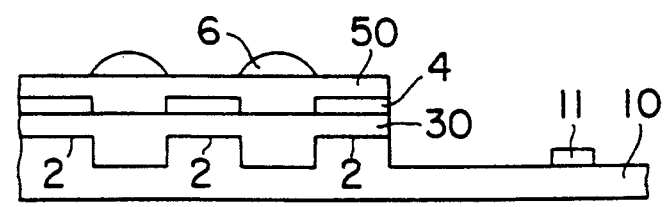

Finally, as shown in FIG. 1E, the films 80 and 90 are removed to obtain a required solid state image sensing device.

Figure 2:
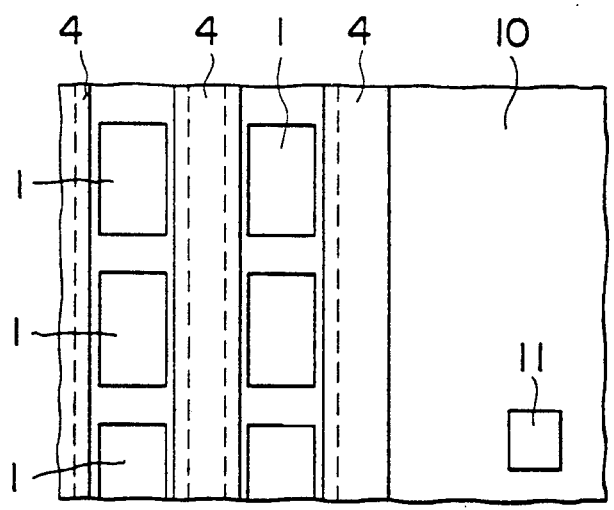
FIG. 2 is a plan view showing the positions of the light reflection preventing film relative to the photodiode portions.

In the case of the solid state image sensing device manufactured as described above, since the electrode surfaces on the bonding pads are exposed by selectively and collectively removing the transparent thermosetting resin layers, it is possible to accurately locate the light reflection preventing film 4 relative to the photodiode portions 1 as shown in FIG. 2.

Further, in the embodiment shown in FIG. 1, the solid state image sensing device having no color filters has been described by way of example. Without being limited thereto, however, it is also possible to apply the structure and the manufacturing method according to the present invention to the solid state image sensing device including a plurality of different color filter layers, by using the transparent thermosetting resin instead of the conventional transparent photo-crosslinking resin.

Figure 3:
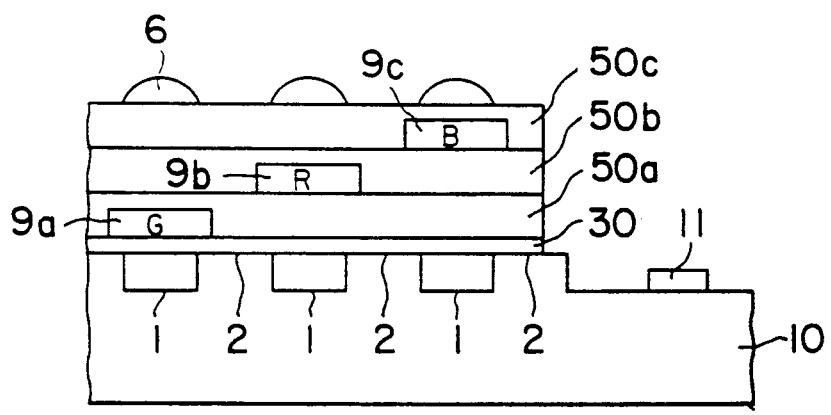
FIG. 3 is a cross-sectional view showing the elements of another embodiment of according to the present invention.

FIGS. 3 and 4 are cross-sectional and plan views showing another embodiment of the solid state image sensing device according to the present invention, in which three primary color (green, red and blue) filters 9a, 9b and 9c of different layers are formed in strip fashion along the column direction of the two dimensionally arranged photodiodes 1. In this embodiment, the dye preventing layers 50a, and 50b formed between the respective color filter layers and the smoothing layer 50c are also formed by the thermosetting resin.

In the case of the prior art solid state image sensing device which uses the conventional transparent photo-setting resin layers, the ratio of the defectiveness (as shown in FIG. 2) to 100 pieces of the device is about 0.8. In the case of the solid state image sensing device according to the present invention, since the transparent resin layer of photo-crosslinking type is replaced with the transparent resin layer of thermosetting type, it has become possible to eliminate the defectiveness of the devices. This is because the use of the thermosetting resin allows the light reflection preventing film, the lens, the color filters, etc. to be maintained stably, so that it is possible to reduce the mutual positional variations between these layers.

This invention is also applicable to an image sensing device having linearly arranged photodiodes.

As described above, in the solid state image sensing device according to the present invention, after the color filter layers, the condenser lens layer and/or the light reflection preventing film layer have been all formed by the transparent thermosetting resin and maintained at the respective predetermined positions, respectively; and the transparent thermosetting resin layers are selectively and collectively etched. Therefore, it has become possible to eliminate the positional change between the color filters, the condenser lens layer, and the light reflection preventing film layer, etc. due to the shrinkage of the smoothing layer, the photoresist printing layer, and the protective layer, thus markedly reducing the defectiveness ratio of the solid state image sensing device.

What is claimed is:

1. A method of manufacturing a solid state image sensing device, comprising the steps of:

forming a photosensitive portion and a CCD portion on a semiconductor substrate surface;

forming an electrode on the semiconductor substrate surface;

forming a first transparent thermosetting resin layer all over the surface and heating the formed first resin layer;

forming a light reflection preventing layer away from said photosensitive portion on the first transparent thermosetting resin layer;

forming a second transparent thermosetting resin layer all over the surface and heating the formed second resin layer;

selectively forming a lens layer over the photosensitive portion on the second transparent thermosetting resin layer;

forming a third transparent thermosetting resin layer all over the surface thereof and heating the formed third resin layer;

forming a photosensitive resin layer on the surface thereof, exposing the formed resin layer with a pattern for exposing a surface of said electrode, and forming a mask layer by development; and exposing the electrode surface by selectively removing all the transparent thermosetting resin layers with the formed mask layer.

2. A method of manufacturing a solid state image sensing device, comprising the steps of:

forming a photosensitive portion and a CCD portion on a semiconductor substrate surface;

forming an electrode on the semiconductor substrate surface;

forming a first transparent thermosetting resin layer all over the surface thereof and heating the formed first resin layer;

forming second transparent thermosetting resin layers above said photosensitive portion on the formed first transparent thermosetting resin layer;

forming a third transparent thermosetting resin layer on the second transparent thermosetting resin layer and heating the formed third resin layer;

selectively forming a condenser lens layer over the photosensitive portion on the third transparent thermosetting resin layer;

forming a fourth transparent thermosetting resin layer all over the surface thereof and heating the formed fourth resin layer;

forming a photosensitive resin layer on the surface thereof, exposing the formed resin layer with a pattern for exposing a surface of said electrode, and forming a mask layer by development; and exposing the electrode surface by selectively removing all the transparent thermosetting resin layers with the formed mask layer.

3. A method of manufacturing a solid state image sensing device, comprising the steps of:

forming a photosensitive portion and a CCD portion on a semiconductor substrate surface;

forming an electrode on the semiconductor substrate surface;

forming a first transparent thermosetting resin layer all over the surface thereof and heating the formed first resin layer;

forming second transparent thermosetting resin layers above said photosensitive portion on the formed first transparent thermosetting resin layer by sandwiching one of a plurality of color filter layers between two of the formed second resin layers, respectively and by heating the formed second resin layers, respectively;

forming a third transparent thermosetting resin layer on the uppermost color filter layer and heating the formed third resin layer;

forming a condenser lens layer over the photosensitive portion on the third transparent thermosetting resin layer;

forming a fourth transparent thermosetting resin layer all over the surface thereof and heating the formed fourth resin layer;

forming a photosensitive resin layer on the surface thereof, exposing the formed resin layer with a pattern for exposing a surface of said electrode, and forming a mask layer by development; and exposing the electrode surface by selectively removing all the transparent thermosetting resin layers with the formed mask layer.

* * * * *